(12) United States Patent
Kovsh et al.

(10) Patent No.: US 7,642,562 B2
(45) Date of Patent: Jan. 5, 2010

(54) LONG-WAVELENGTH RESONANT-CAVITY LIGHT-EMITTING DIODE

(75) Inventors: Alexey Kovsh, Dortmund (DE); Igor Krestnikov, Dortmund (DE); Sergey Mikhrin, Dortmund (DE); Daniil Livshits, Dortmund (DE)

(73) Assignee: Innolume GmbH, Dortmund (DE)

( * ) Notice: Subject to any disclaimer, the term of this patent is extended or adjusted under 35 U.S.C. 154(b) by 0 days.

(21) Appl. No.: 11/864,059

(22) Filed: Sep. 28, 2007

(65) Prior Publication Data

US 2008/0079016 A1 Apr. 3, 2008

Related U.S. Application Data

(60) Provisional application No. 60/827,515, filed on Sep. 29, 2006.

(51) Int. Cl.
*H01L 33/00* (2006.01)

(52) U.S. Cl. .............................. 257/98; 257/94; 257/95; 257/96

(58) Field of Classification Search .................. 257/98, 257/94, 95, 96
See application file for complete search history.

(56) References Cited

U.S. PATENT DOCUMENTS

| | | | |
|---|---|---|---|
| 5,226,053 A | 7/1993 | Cho et al. | |
| 6,063,643 A | 5/2000 | Dutta | |
| 6,661,031 B2 | 12/2003 | Takaoka | |
| 6,881,984 B2 | 4/2005 | Takaoka | |
| 6,906,353 B1* | 6/2005 | Shieh et al. | .................. 257/98 |
| 7,019,330 B2 | 3/2006 | Ludowise | |
| 7,324,574 B2* | 1/2008 | Kim | ....................... 372/50.21 |
| 2008/0079016 A1 | 4/2008 | Kovsh et al. | |

FOREIGN PATENT DOCUMENTS

| | | |
|---|---|---|
| WO | 2004112153 A2 | 12/2004 |
| WO | 2007021509 A2 | 2/2007 |

OTHER PUBLICATIONS

E.F. Schubert, et al, "Resonant cavity light-emitting diode", Appl. Phys. Lett., 60 (8), Feb. 24, 1992, pp. 921-923.

(Continued)

*Primary Examiner*—Long Pham
(74) *Attorney, Agent, or Firm*—Brown & Michaels, PC

(57) ABSTRACT

An efficient long-wavelength light-emitting diode has a resonant-cavity design. The light-emitting diode preferably has self-organized (In,Ga)As or (In,Ga)(As,N) quantum dots in the light-emitting active region, deposited on a GaAs substrate. The light-emitting diode is capable of emitting in a long-wavelength spectral range of preferably 1.15-1.35 μm. The light-emitting diode also has a high efficiency of preferably at least 6 mW and more preferably at least 8 mW at an operating current of less than 100 mA and a low operating voltage of preferably less than 3V. In addition, the light-emitting diode preferably has an intensity of maxima, other than the main maximum of the emission spectrum, of less than 1% of an intensity of the main maximum. This combination of parameters makes such a device useful as an inexpensive optical source for various applications.

22 Claims, 9 Drawing Sheets

OTHER PUBLICATIONS

E.F. Schubert and N.E.J. Hunt, "15000 hrs stable operation of resonant cavity light emitting diodes", Applied Physics A, vol. 66, No. 3, 1998, pp. 319-321.

M. Jalonen J. Kongas, et al, "Monolithic 1.3 resonant cavity light emitting diode grown by solid source molecular beam epitaxy", Electronic Letters vol. 34 No. 15, Jul. 23, 1998, pp. 1519-1520.

J.W. Gray, et al, "Quantum dot resonant cavity light emitting diode operating near 1300nm", Electronic Letters,vol. 35 No. 3. Feb. 4, 1999, pp. 242-243.

F. Salomonsson, et al, "InP-based 1.55 1m Resonant Cavity Light-Emitting Diode with two Epitaxial Mirrors", 1999, 135E237. Physica Scripta. vol. T79, pp. 135-137.

I. L. Krestnikov, et al, "1.3 μm resonant-cavity InGaAs/GaAs quantum dot light-emitting devices" Semicond. Sci. Technol. 16, (2001), pp. 844-848, D. Delbeke, et al, "High-Efficiency Semiconductor Resonant-Cavity Light-Emitting Diodes: A Review", IEEE Journal on Selected Topics in Quantum Electronics, vol. 8, No. 2, Mar./Apr. 2002, pp. 189-206.

R.H. Birkner, et al, "Resonant-cavity light-emitting diodes: quantum noise and spatial emission characteristics", Applied Physics B, vol. 79, No. 8 2004, pp. 963-967.

\* cited by examiner

US 7,642,562 B2

LONG-WAVELENGTH RESONANT-CAVITY LIGHT-EMITTING DIODE

REFERENCE TO RELATED APPLICATIONS

This application claims an invention which was disclosed in Provisional Application No. 60/827,515, filed Sep. 29, 2006, entitled "LONG-WAVELENGTH RESONANT-CAVITY LIGHT-EMITTING DIODE". The benefit under 35 USC § 119(e) of the United States provisional application is hereby claimed, and the aforementioned application is hereby incorporated herein by reference.

BACKGROUND OF THE INVENTION

1. Field of the Invention

This invention pertains to light-emitting diodes and, more specifically, to light-emitting diodes having a resonant-cavity design.

2. Description of Related Art

A resonant-cavity light-emitting diode has an advantage over a conventional light-emitting diode because of its higher efficiency. This means that more optical power can be provided by the device at a certain operating current. Another advantage is that a vertical light emission is naturally achieved. A resonant-cavity light-emitting diode also has advantages over a semiconductor laser, in particular over a vertical-cavity surface emitting laser, because its emission spectrum may have a spectral width of 10 nm or more, being rather smooth (without lasing modes).

A long-wavelength resonant-cavity light-emitting diode made on a GaAs substrate may have advantages over long-wavelength resonant-cavity light-emitting diodes made on substrates of other types because of the cheapness of GaAs substrates, their availability with large diameter (e.g. 6 inches), their high quality, and ease of formation of highly-reflective distributed Bragg reflectors in an AlGaAs material system. A disadvantage of current long-wavelength resonant-cavity light-emitting diodes made on a GaAs substrate is a lack of a light-emitting active region, having a sufficient structural and optical quality, being capable of emitting at sufficiently long wavelengths.

InGaAsN quantum wells and (In,Ga)As quantum dots have been recently proposed as an active region of long-wavelength light-emitting devices fabricated on GaAs substrates. An InGaAsN quantum well has a disadvantage of typically low radiative recombination efficiency, which makes it difficult to fabricate a device with sufficiently low operating current. (In,Ga)As quantum dots may be free of this disadvantage.

A method for a resonant-cavity light-emitting diode forms a resonant cavity including a light-emitting active region on a bottom-side distributed Bragg reflector having high reflectivity within a certain stop-band. Because of the joint effect of the distributed Bragg reflector and the resonant cavity, intensity of the light which is emitted from the surface of the device is enhanced while the emission spectrum is modified. An output spectrum of a resonant-cavity light-emitting diode may include several spectral maxima with spectral positions that correspond to spectral minima in a reflectance spectrum of the resonant-cavity light-emitting diode.

It is usually preferred that an output spectrum of a long wavelength resonant-cavity light-emitting diode has a single spectral maximum or at least the main maximum dominates well over maxima, other than the main maximum. However, a quantum dot active region is usually characterized by a relatively broad spectrum of emission due in particular to luminescence of excited state(s). This excited-state luminescence may be stronger than the ground-state luminescence if a current density is sufficiently high. The excited-state luminescence may result in appearance of additional maximum or maxima in the output spectrum of the quantum-dot resonant-cavity light-emitting diode. Moreover, intensity of these maxima may be high in comparison to an intensity of the main maximum of the output spectrum. Such a behavior significantly restricts possible device applications of quantum-dot resonant-cavity light-emitting diodes.

Thus, there is a need in the art for a resonant-cavity light emitting diode made on a GaAs substrate with self-organized quantum dots as the light-emitting active region, the diode being capable of emitting in a range from approximately 1.15 to 1.35 μm, having a sufficiently high optical power and sufficiently low operating current, and having intensity of maxima, other than the main maximum of the emission spectrum, not higher than 1% of an intensity of the main maximum.

SUMMARY OF THE INVENTION

The present invention includes a layered structure of a resonant-cavity light-emitting diode deposited on a substrate. The substrate is preferably an n-type GaAs substrate. The layered structure preferably includes an n-type doped bottom-side distributed Bragg reflector, a resonant cavity comprising a light-emitting active region including self-organized quantum dots, a p-n junction, which is capable of providing electrons and holes to the active region under forward bias, and a top-side distributed Bragg reflector. The self-organized quantum dots are preferably (In,Ga)As or (In,Ga)(As,N) quantum dots. The semiconductor layers are preferably grown using molecular beam epitaxy.

DETAILED DESCRIPTION OF THE INVENTION

Figure 1:
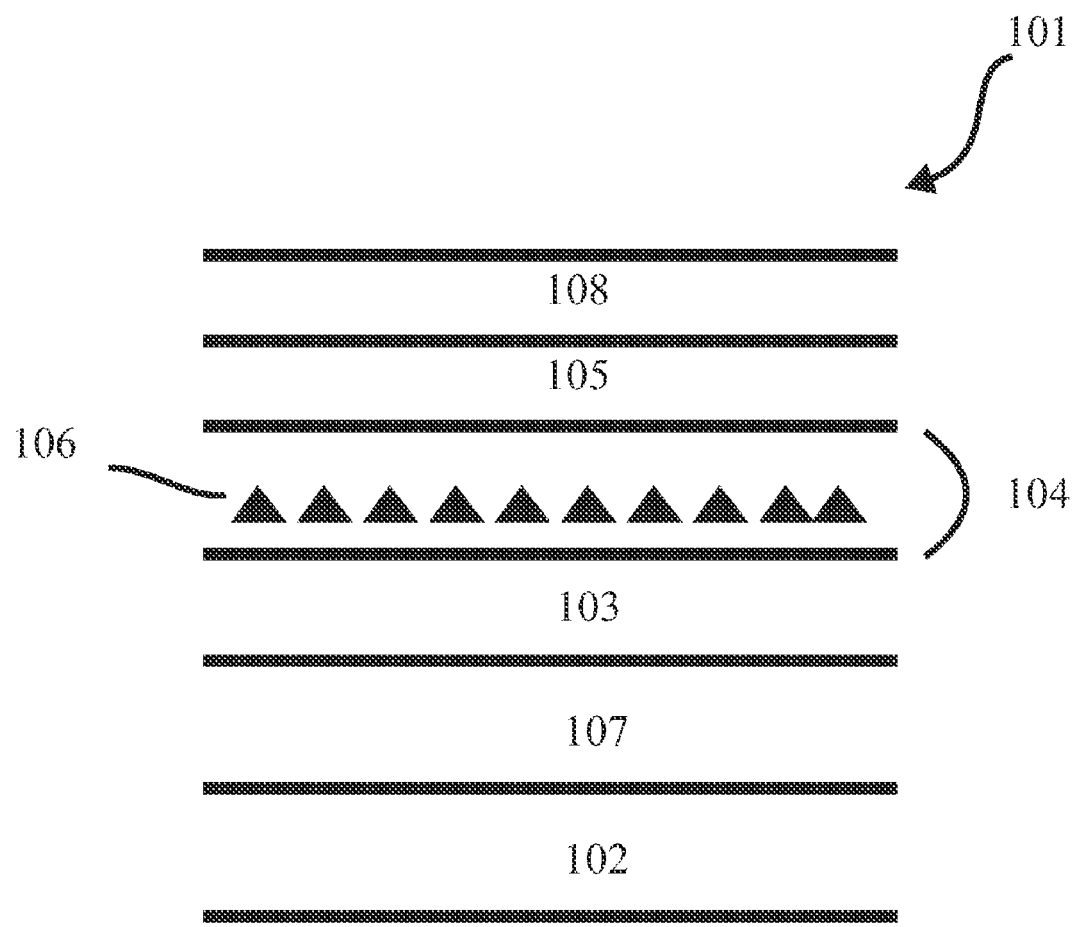
FIG. 1 schematically shows an example of an epitaxial structure of a resonant-cavity light-emitting diode according to an embodiment of the present invention.

A long-wavelength resonant-cavity light-emitting diode, having an emission wavelength in a range from approximately 1.15 to 1.35 μm may be useful for various applications provided that its optical power is sufficiently high (e.g. more than 6 mW)

The present invention provides a resonant-cavity light-emitting diode made on a GaAs substrate with (In,Ga)As or (In,Ga)(As,N) self-organized quantum dots as the light-emitting active region. In a preferred embodiment, the (In,Ga)(As,N) quantum dots have a very low nitrogen content. The light-emitting diode is capable of emitting in a range from approximately 1.15 to 1.35 μm. The light-emitting diode also has an optical power preferably greater than 6 mW and an operating current preferably less than 100 mA. The light-emitting diode also has an intensity of maxima, other than the main maximum of the emission spectrum, less than or equal to 1% of an intensity of the main maximum.

The present invention includes a resonant-cavity light-emitting diode with a layered structure deposited on a substrate. The substrate is preferably an n-type GaAs substrate. The layered structure preferably includes the following parts: an n-type doped bottom-side distributed Bragg reflector, a resonant cavity comprising a light-emitting active region including self-organized quantum dots, a p-n junction, which is capable of providing electrons and holes to the active region under forward bias, and a top-side distributed Bragg reflector. The self-organized quantum dots are preferably (In,Ga)As or (In,Ga)(As,N) quantum dots. The semiconductor layers are preferably grown using molecular beam epitaxy.

In one embodiment, the top-side distributed Bragg reflector is made of p-type doped semiconductor materials. In another embodiment, the top-side distributed Bragg reflector is made of dielectric materials.

The layered structure may further include a buffer layer between the substrate and the bottom-side distributed Bragg reflector. The buffer layer is preferably an n-type doped GaAs layer. In one embodiment, the layered structure may also further include a contact layer on top of the semiconductor top-side distributed Bragg reflector. The contact layer is preferably a p-type doped GaAs contact layer.

The resonant cavity is preferably made of GaAs. The resonant cavity may include an n-type doped region adjacent to the bottom-side distributed Bragg reflector, a p-type doped region adjacent to the top-side distributed Bragg reflector and an undoped region between them.

In one embodiment, the p-n junction is formed by the n-type doped region and the p-type doped region of the resonant cavity. In an alternative embodiment, the p-n junction is formed by the n-type doped bottom-side distributed Bragg reflector and the p-type doped semiconductor top-side distributed Bragg reflector.

The layered structure is preferably processed into an array of mesa structures by etching through the resonant cavity. An n-ohmic contact is formed continuously on the bottom surface of the substrate. A p-ohmic contact is formed partly on the top surface of the mesa structure. In one embodiment, the p-ohmic contact is formed to the p-type doped GaAs contact layer deposited on top of the semiconductor top-side distributed Bragg reflector. In another embodiment, the p-ohmic contact is formed to the p-type doped region of the resonant cavity.

In one embodiment, the formation of the resonant-cavity light-emitting diode is completed by dicing the array of mesa structures into discrete devices.

In operation, when a forward bias is applied to the p- and n-ohmic contacts, the p-n junction provides electrons and holes to the active region, the light is emitted by the quantum-dot active region, the light is enhanced because of resonant-cavity effect, and the light is extracted from the top surface of the mesa structure through those parts which are not covered with the p-ohmic contact.

Growth conditions, chemical composition and other parameters of the quantum dots affecting the wavelength of emission, the resonant cavity and the distributed Bragg reflectors are preferably selected such that the emission spectrum of the resonant-cavity light-emitting diode has a main maximum which falls into a spectral range from approximately 1.15 to 1.35 μm. The spectral width (full width at half maximum) of the main maximum is preferably about 20 to 30 nm. An intensity of maxima, other than the main maximum of the emission spectrum, is preferably not higher than 1% of an intensity of the main maximum.

In order to suppress the intensity of the maxima, other than the main maximum, of the emission spectrum, special measures may be undertaken. These measures may include, but are not limited to, an increase of an area of the mesa structure; use of a quantum well inside the resonant cavity, which is capable of absorbing the excited-state luminescence; or the use of a top-side distributed Bragg reflector with a broad stopband.

The increase of the area of the mesa structure leads to a corresponding reduction in the current density for the same level of the current. As a result, the excited-state luminescence of quantum dots is less pronounced. Each mesa structure preferably has an area from 200 μm by 200 μm to 500 by 500 μm.

The use of a quantum well inside the resonant cavity, which is capable of absorbing the excited-state luminescence, may result in suppression of the intensity of the maxima, other than the main maximum of the emission spectrum. In one embodiment, the quantum well is preferably an InGaAs quantum well with an absorption peak shifted by approximately 70-100 nm to shorter wavelength as compared to the wavelength of the ground state luminescence of the quantum dot active region.

A top-side distributed Bragg reflector with a broad stopband, i.e. with a broad spectral interval of high reflectivity, deposited on top of the resonant cavity may increase the reflectivity of spectral minima, other than the central minimum, in a reflectance spectrum of the resonant-cavity light-emitting diode. As a result, the intensity of the maxima, other than the main maximum, of the emission spectrum may be suppressed. A dielectric distributed Bragg reflector may be used for this purpose.

The bottom-side distributed Bragg reflector is designed such that the reflectivity at the wavelengths of the main maximum of the emission spectrum is preferably close to 100%. The top-side distributed Bragg reflector is designed such that the reflectivity at the wavelengths of the main maximum of the emission spectrum is preferably about 70 to 90%.

The bottom-side distributed Bragg reflector is preferably made of pairs of AlGaAs and GaAs layers. In one embodiment, the semiconductor top-side distributed Bragg reflector is preferably made of pairs of AlGaAs and GaAs layers. The aluminum content in the AlGaAs layers is preferably more than 80%. Preferably, a thickness of the AlGaAs layer and a thickness of the GaAs layers is approximately equal to a quarter of the wavelength of the main maximum of the emission spectrum divided by a refractive index of the corresponding material. The number of AlGaAs/GaAs pairs which constitute the bottom-side distributed Bragg reflector is preferably about 20 to 30. The number of AlGaAs/GaAs pairs which constitute the semiconductor top-side distributed Bragg reflector is preferably about 5 to 10.

A thickness of the resonant cavity is preferably a multiple of a half of the wavelength of the main maximum of the emission spectrum divided by a refractive index of the material. The cavity thickness is preferably $0.5\lambda/n$, $1.0\lambda/n$, $1.5\lambda/n \ldots$, where $\lambda$ is wavelength of emission, and n is the refractive index. More preferably, the thickness of the resonant cavity is approximately 1.5 or 2 half-lambda.

The light-emitting active region may include several planes of self-organized (In,Ga)As or (In,Ga)(As,N) quantum dots separated by GaAs. The planes of quantum dots may be gathered in groups. Each group of quantum dot planes is preferably located near a maximum of a standing-wave optical mode inside the resonant cavity. The number of quantum dot planes in each group preferably does not exceed 3. A thickness of the GaAs layers which separate quantum dot planes of a group is preferably about 20-35 nm. A total number of the quantum dot planes in the resonant cavity is preferably from 6 to 12.

In a preferred embodiment, each quantum dot plane is formed by deposition of 1.7-2.5 monolayers of InAs capped with InGaAs having a thickness from 3 to 10 nm and an indium content from 10 to 20%.

In another embodiment, each quantum dot plane is formed by deposition of 1.7-2.5 monolayers of InAs capped with InGaAsN having a thickness from 3 to 10 nm, an indium content from 10 to 20% and an nitrogen content of 0.1 to 2.5%.

In still another embodiment, each quantum dot plane is formed by deposition of 1.7-2.5 monolayers of InAsN with an nitrogen content of 0.1 to 2.5% capped with InGaAsN having a thickness from 3 to 10 nm, an indium content from 10 to 20% and an nitrogen content of 0.1 to 2.5%.

(In,Ga)(As,N) quantum dots with a very low nitrogen content may have certain advantage over nitrogen-free (In,Ga)As quantum dots because adding nitrogen promotes higher surface density of the quantum dot array and, as a result, a higher intensity of ground-state luminescence from the quantum dots.

In a preferred embodiment, the epitaxial structure further includes a current spreading layer which improves a uniformity of the current density over the area of the mesa structure. The current spreading layer may force holes injected from the p-ohmic contact to spread over the whole area of the mesa structure. The current spreading layer may be located inside or at a border of the p-doped contact layer, the p-doped region of the resonant cavity, or the top-side distributed Bragg reflector. The current spreading layer may represent a heavily p-type doped GaAs layer, a weakly p-doped or undoped AlGaAs layer, or a combination of both.

The long-wavelength resonant-cavity light-emitting diode of the present invention preferably emits at least 6 mW and more preferably at least 8 mW at an operating current of less than 100 mA and an operation voltage of less than 3 V.

FIG. 1 schematically shows an example of a layered structure (101) of a resonant-cavity light-emitting diode according to one embodiment of the present invention. The structure (101) is deposited on substrate (102) by molecular beam epitaxy. The substrate is preferably an n-type GaAs substrate. The structure (101) includes an n-type doped bottom-side distributed Bragg reflector (103), a resonant cavity (104) including a light-emitting active region (106) including self-organized quantum dots, and a p-type doped semiconductor top-side distributed Bragg reflector (105). The quantum dots are preferably (In,Ga)As or (In,Ga)(As,N) quantum dots. The epitaxial structure (101) also includes a buffer layer (107) between the substrate (102) and the bottom-side distributed Bragg reflector (103). The buffer layer is preferably an n-type doped GaAs buffer layer. The epitaxial structure (101) also includes a contact layer (108) on top of the top-side semiconductor distributed Bragg reflector (105). The contact layer (108) is preferably a p-type doped GaAs contact layer. In this structure the p-n junction is formed by the n-type doped bottom-side distributed Bragg reflector (103) and the p-type doped semiconductor top-side distributed Bragg reflector (105).

Figure 2:
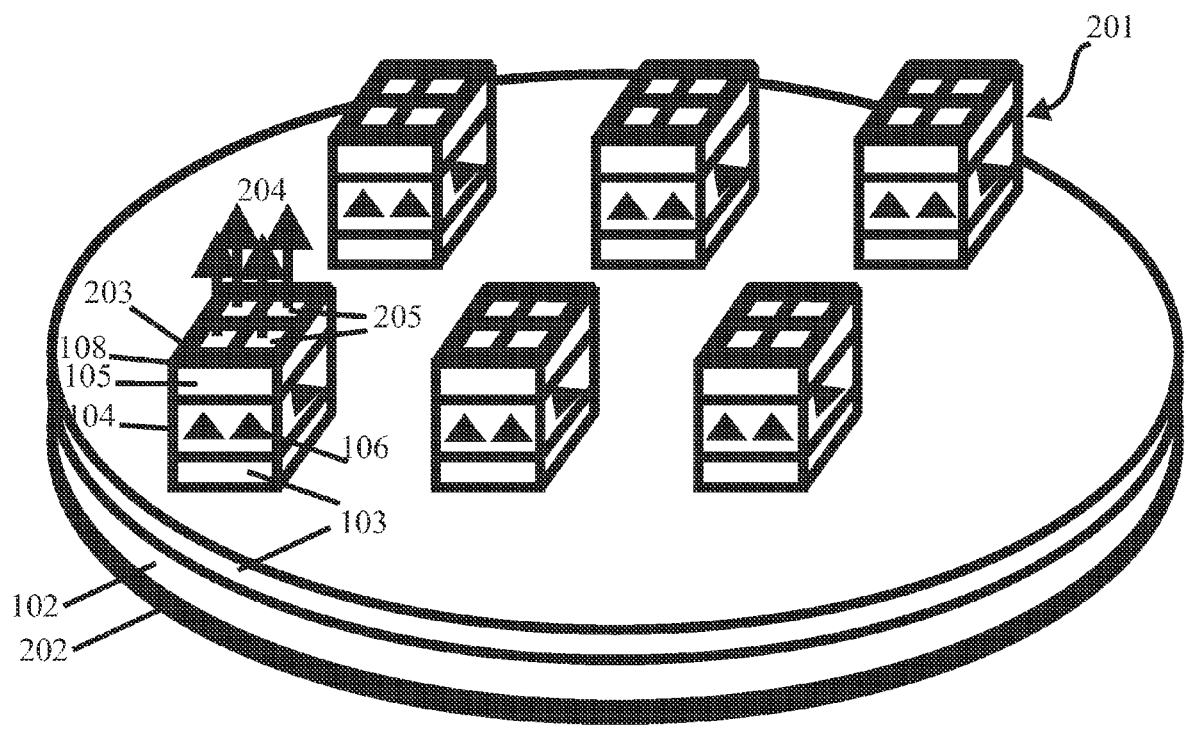
FIG. 2 schematically shows an example of an array of mesa structures with ohmic contacts according to an embodiment of the present invention.

FIG. 2 schematically shows an example of an array of mesa structures (201) fabricated with the layered structure (101) of FIG. 1 according to an embodiment of the present invention by etching through the top-side distributed Bragg reflector (105) and the resonant cavity (104). In this example, the etched mesa partly penetrates into the bottom-side distributed Bragg reflector (103). An n-ohmic contact (202) is formed continuously on the bottom surface of the substrate (102). A p-ohmic contact (203) is formed partly on the top surface of the mesa structure (201) to the p-type doped GaAs contact layer (108) deposited on top of the semiconductor top-side distributed Bragg reflector (105).

If a forward bias is applied to the p-ohmic contact (203) and the n-ohmic contact (202), the p-n junction, formed by the n-type doped bottom-side distributed Bragg reflector (103) and the p-type doped semiconductor top-side distributed Bragg reflector (105), provides electrons and holes to the active region (106). The light (204), emitted in the active region (106), is extracted from the top surface of the mesa structure (201) through those parts (205) which are not covered with the p-ohmic contact (203).

In one embodiment, the mesa structure preferably has an area from 200 μm by 200 μm to 500 by 500 μm. Thus, the current density is reduced and the excited-state luminescence of quantum dots is suppressed.

Figure 3:
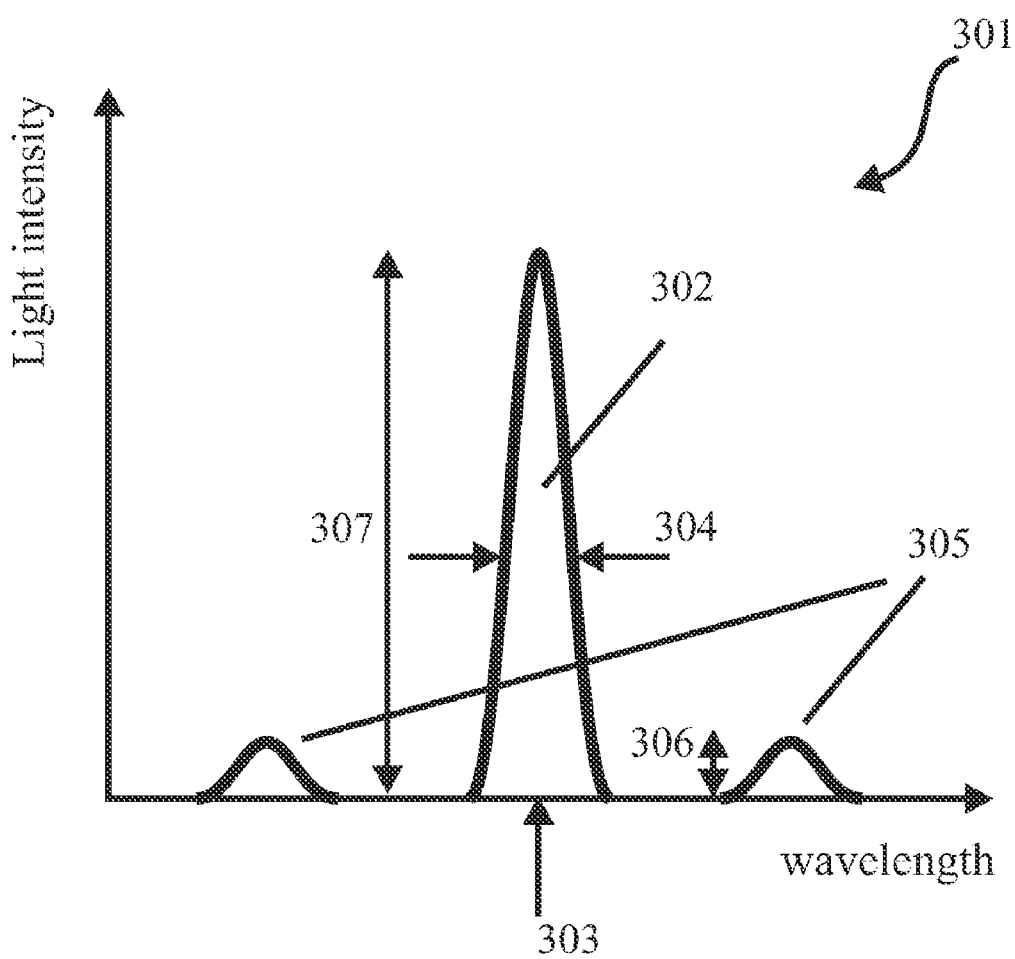
FIG. 3 schematically illustrates an emission spectrum of the resonant-cavity light-emitting diode.

An emission spectrum (301) of the resonant-cavity light-emitting diode is illustrated in FIG. 3. Growth conditions, chemical composition and other parameters of the quantum dots (106) affecting the wavelength of emission, the resonant cavity (104) and the distributed Bragg reflectors (103) and (105) are preferably selected such that the emission spectrum (301) has a main maximum (302) with a wavelength (303) that falls into a spectral range from approximately 1.15 to 1.35 μm. The spectral width (full width at half maximum) (304) of the main maximum (302) is preferably about 20 to 30 nm. An intensity (306) of maxima (305), other than the main maximum (302) of the emission spectrum (301), is preferably not higher than 1% of an intensity (307) of the main maximum (302).

Figure 4:
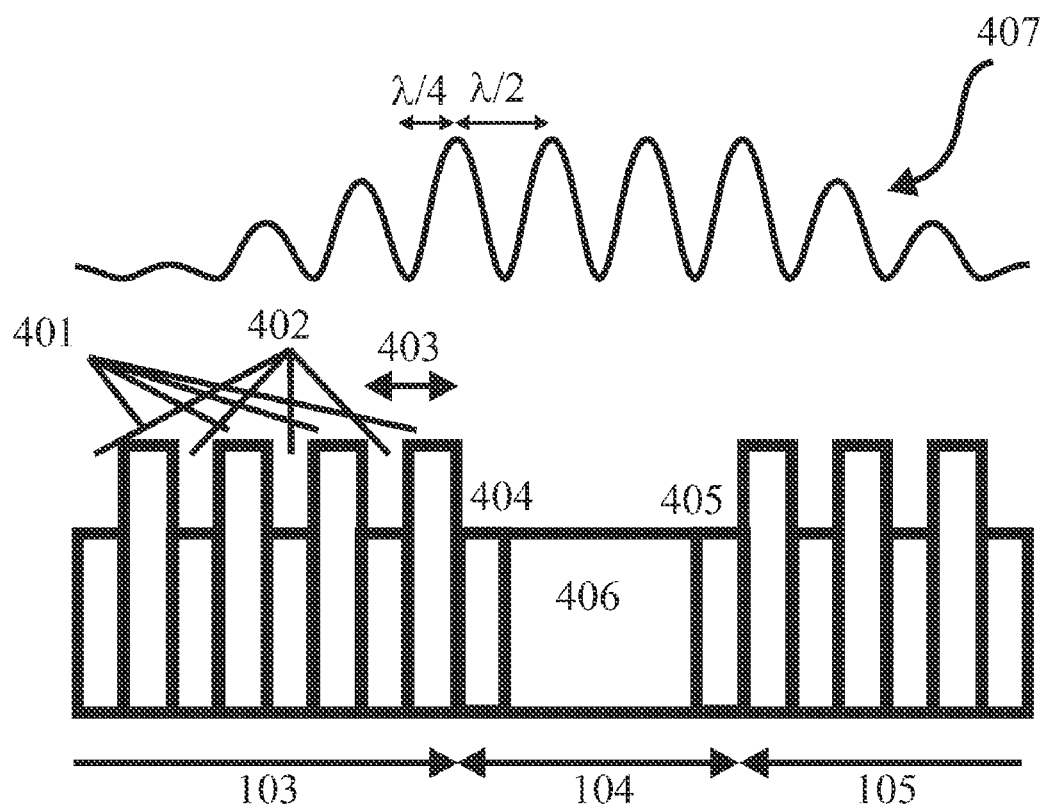
FIG. 4 schematically illustrates an example of the resonant cavity and the distributed Bragg reflectors.

FIG. 4 schematically illustrates an example of the resonant cavity (104), the bottom-side distributed Bragg reflector (103) and the top-side semiconductor distributed Bragg reflector (105) according to an embodiment of the present invention. FIG. 4 also schematically shows a standing-wave optical mode (407). The top-side (105) and the bottom-side (103) distributed Bragg reflectors are made of pairs (403) of AlGaAs layers (401) and GaAs layers (402) in this embodiment. The aluminum content in the AlGaAs layers (401) is preferably 90%. The thickness of the AlGaAs layers (401) and the thickness of the GaAs layers (402) are approximately equal to a quarter of the wavelength of the main maximum of the emission spectrum divided by a refractive index of the corresponding material. The number of AlGaAs/GaAs pairs (403) which constitute the bottom-side distributed Bragg reflector (103) is preferably about 20 to 30 such that the reflectivity at the wavelengths of the main maximum of the emission spectrum is preferably close to 100%. The number of AlGaAs/GaAs pairs (403) which constitute the top-side distributed Bragg reflector (105) is preferably about 5 to 10 such that the reflectivity at the wavelengths of the main maximum of the emission spectrum is preferably about 70 to 90%.

The resonant cavity (104) is preferably made of GaAs. The resonant cavity (104) is shown to include an n-type doped region (404) adjacent to the bottom-side distributed Bragg reflector (103), a p-type doped region (405) adjacent to the top-side distributed Bragg reflector (105) and an undoped region (406) between them. A thickness of the resonant cavity (104) is preferably a multiple of a half of the wavelength of the main maximum of the emission spectrum divided by a refractive index of the material. The cavity thickness is preferably $0.5\lambda/n$, $1.0\lambda/n$, $1.5\lambda/n$ . . . , where $\lambda$ is wavelength of emission, and n is the refractive index. More preferably, the thickness of the resonant cavity is approximately 1.5 or 2 half-lambda.

Figure 5:
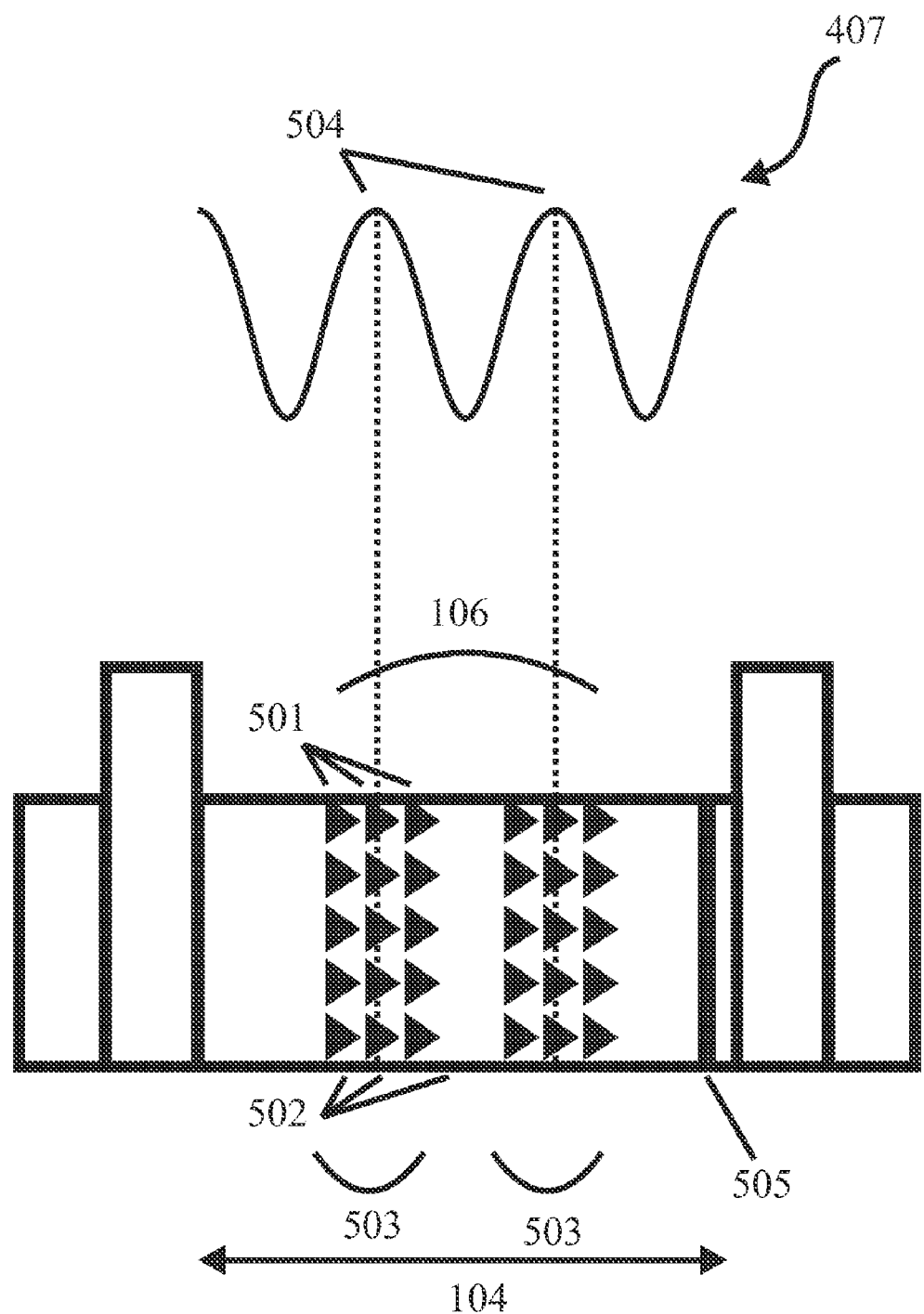
FIG. 5 schematically illustrates an example of the resonant cavity with the light-emitting quantum dot active region.

FIG. 5 schematically illustrates an example of the resonant cavity (104) with the light-emitting quantum dot active region (106). The light-emitting active region may include several planes of self-organized (In,Ga)As or (In,Ga)(As,N) quantum dots (501) separated by GaAs layers (502). The planes of quantum dots (501) may be gathered in groups (503). Each group (503) of quantum dot planes (501) is preferably located near a maximum (504) of a standing-wave optical mode (407) inside the resonant cavity (104). The number of quantum dot planes (501) in each group (503) preferably does not exceed 3. The thickness of the GaAs layers (502), which separate the quantum dot planes of a group (503), is preferably about 20-35 nm. A total number of the quantum dot planes (501) in the resonant cavity (104) is preferably from 6 to 12.

In this example, the resonant cavity (104) further includes a quantum well (505). The quantum well is designed to have an absorption peak shifted by approximately 70-100 nm to a shorter wavelength compared to the wavelength of the ground state luminescence of the quantum dots (501). As a result, the absorption peak of the quantum well (505) approximately coincides with a wavelength of the excited-state luminescence of the quantum dots (501). Therefore, the quantum well (505) is capable of absorbing the excited-state luminescence and, therefore, results in suppression of the intensity of the maxima, other than the main maximum of the emission spectrum.

In a preferred embodiment, each quantum dot plane (501) is formed by deposition of 1.7-2.5 monolayers of InAs capped with InGaAs having a thickness from 3 to 10 nm and an indium content from 10 to 20%.

In another embodiment, each quantum dot plane is formed by deposition of 1.7-2.5 monolayers of InAs capped with InGaAsN having a thickness from 3 to 10 nm, an indium content from 10 to 20% and an nitrogen content of 0.1 to 2.5%.

In still another embodiment, each quantum dot plane is formed by deposition of 1.7-2.5 monolayers of InAsN with an nitrogen content of 0.1 to 2.5% capped with InGaAsN having a thickness from 3 to 10 nm, an indium content from 10 to 20% and an nitrogen content of 0.1 to 2.5%.

In a preferred embodiment, the quantum well (505) is formed by deposition of approximately 5-7 nm of InGaAs having an indium content from 30 to 35%.

Figure 6:
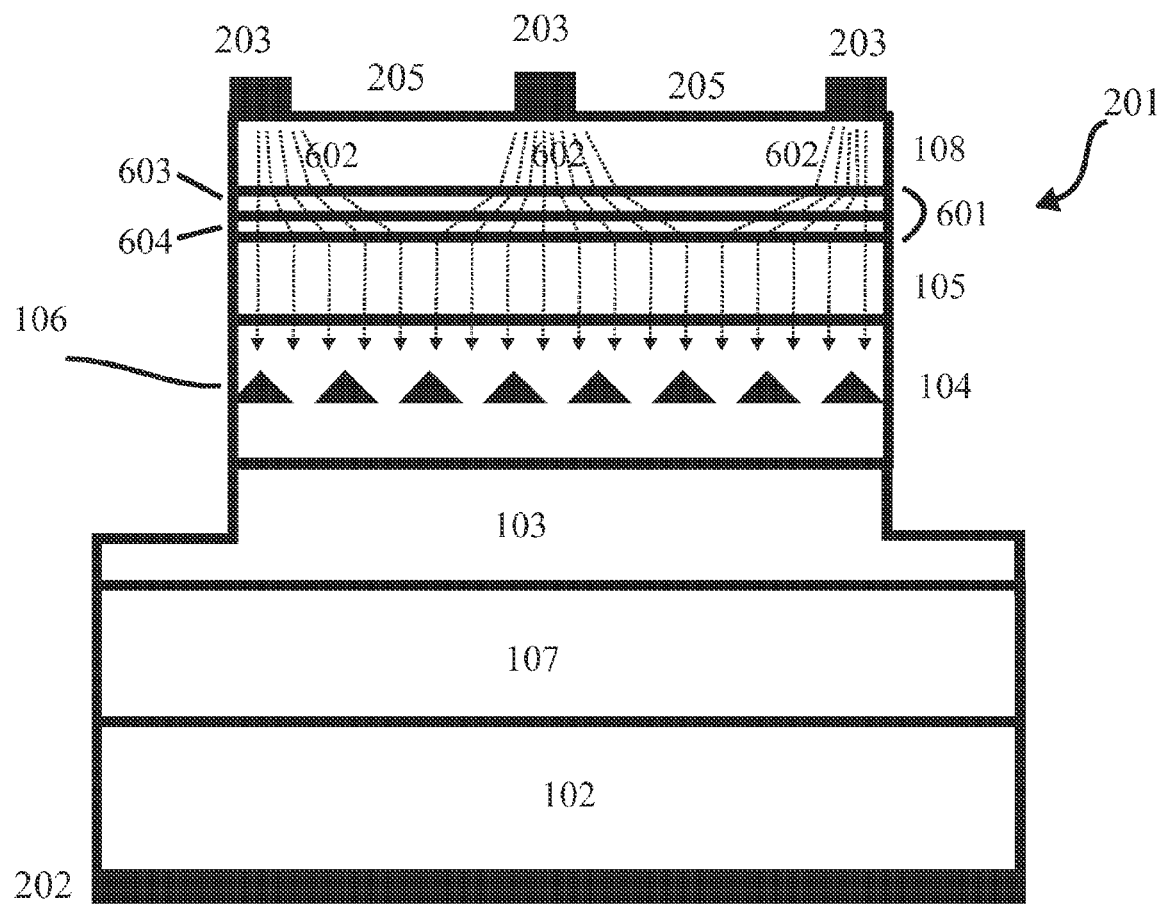
FIG. 6 schematically shows a cross section of a mesa structure according to an embodiment of the present invention.

FIG. 6 shows a cross section of a mesa structure (201) according to a preferred embodiment of the present invention. In this embodiment, the epitaxial structure (201) includes a current spreading region (601) which improves a uniformity of the current density over the area of the mesa structure (201). The current spreading region (601) forces holes (602) injected from the p-ohmic contact (203) to spread over the whole area of the mesa structure (201). The current spreading region (601) is located near an interface of the p-doped contact layer (108) and the top-side p-doped semiconductor distributed Bragg reflector (105). The current spreading region (601) preferably includes a heavily p-type doped GaAs layer (603) and a weakly p-doped AlGaAs layer (604).

Figure 7:
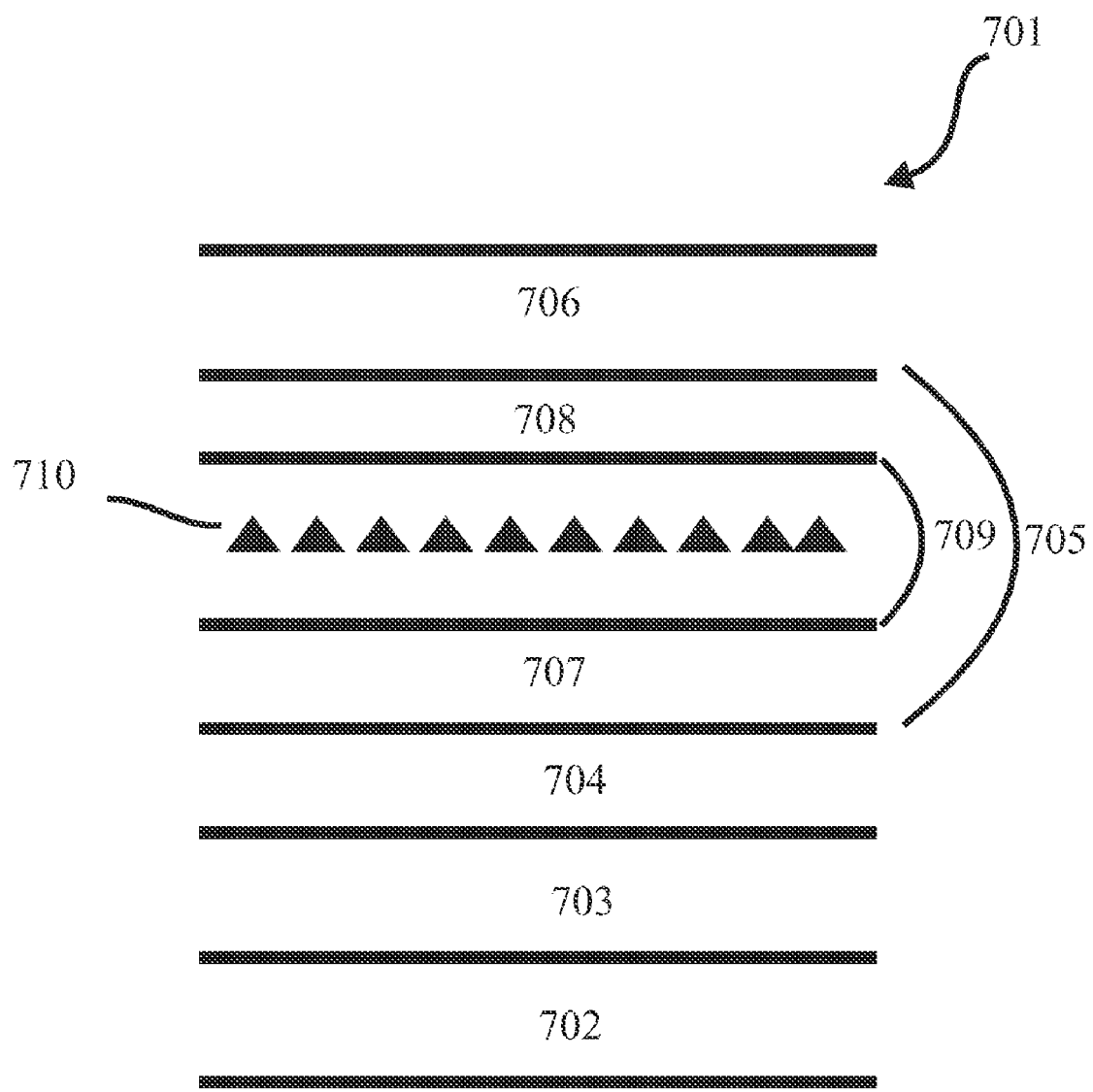
FIG. 7 schematically shows an example of an epitaxial structure of a resonant-cavity light-emitting diode according to another embodiment.

FIG. 7 schematically shows an example of a layered structure (701) of a resonant-cavity light-emitting diode according to another embodiment of the present invention. The structure (701) is deposited on an n-type GaAs substrate (702). The structure (701) includes an n-type doped GaAs buffer layer (703), an n-type doped bottom-side distributed Bragg reflector (704), a resonant cavity (705), and a top-side dielectric distributed Bragg reflector (706).

In one embodiment, the top-side dielectric distributed Bragg reflector (706) may be designed to have a broad stopband.

The resonant cavity (705) includes an n-type doped region (707) adjacent to the bottom-side distributed Bragg reflector (704), a p-type doped region (708) adjacent to the top-side dielectric distributed Bragg reflector (706) and an undoped region (709) between them where a quantum dot light-emitting active region (710) is located.

The semiconductor materials are preferably deposited by molecular beam epitaxy, and the dielectric materials are preferably deposited by known methods of dielectric layer deposition, e.g. by PECVD.

Figure 8:
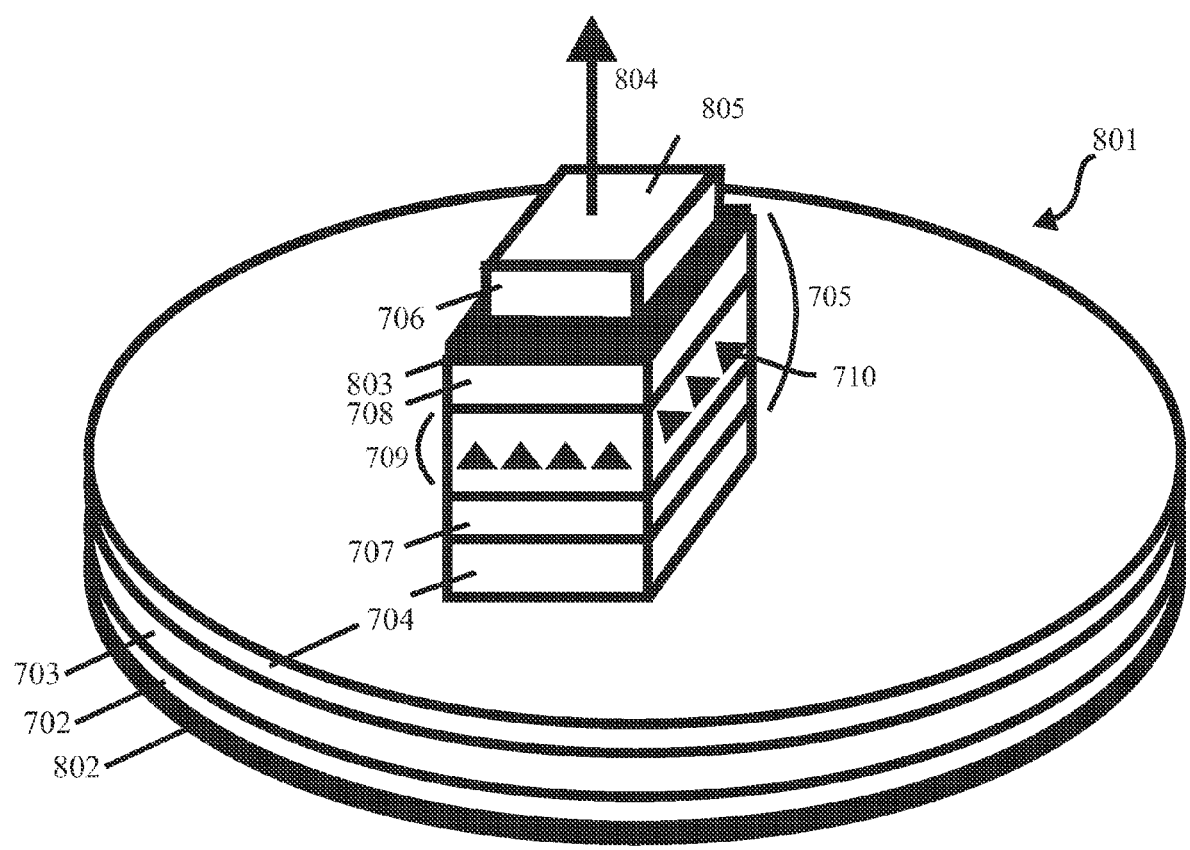
FIG. 8 schematically shows an example of an array of mesa structures with ohmic contacts according to another embodiment of the present invention.

FIG. 8 schematically shows an example of a mesa structure (801) fabricated with the layered structure (701) of FIG. 7 according to another embodiment of the present invention by etching through the resonant cavity (705). The top surface of the mesa structure is formed by partial removal of the top-side dielectric distributed Bragg reflector (706). An n-ohmic contact (802) is formed continuously on the bottom surface of the substrate (702). A p-ohmic contact (803) is formed partly on the top surface of the mesa structure (801) to the p-type doped region (708) of the resonant cavity (705).

If a forward bias is applied to the p-ohmic contact (803) and the n-ohmic contact (802), the p-n junction, formed by the n-type doped region (707) of the resonant cavity (705) and the p-type doped region (708) of the resonant cavity (705), provides electrons and holes to the active region (106). The light (804), emitted in the active region (710), is extracted from the top surface of the mesa structure (801) through a part (805) which is not covered with the p-ohmic contact (803).

Figure 9:
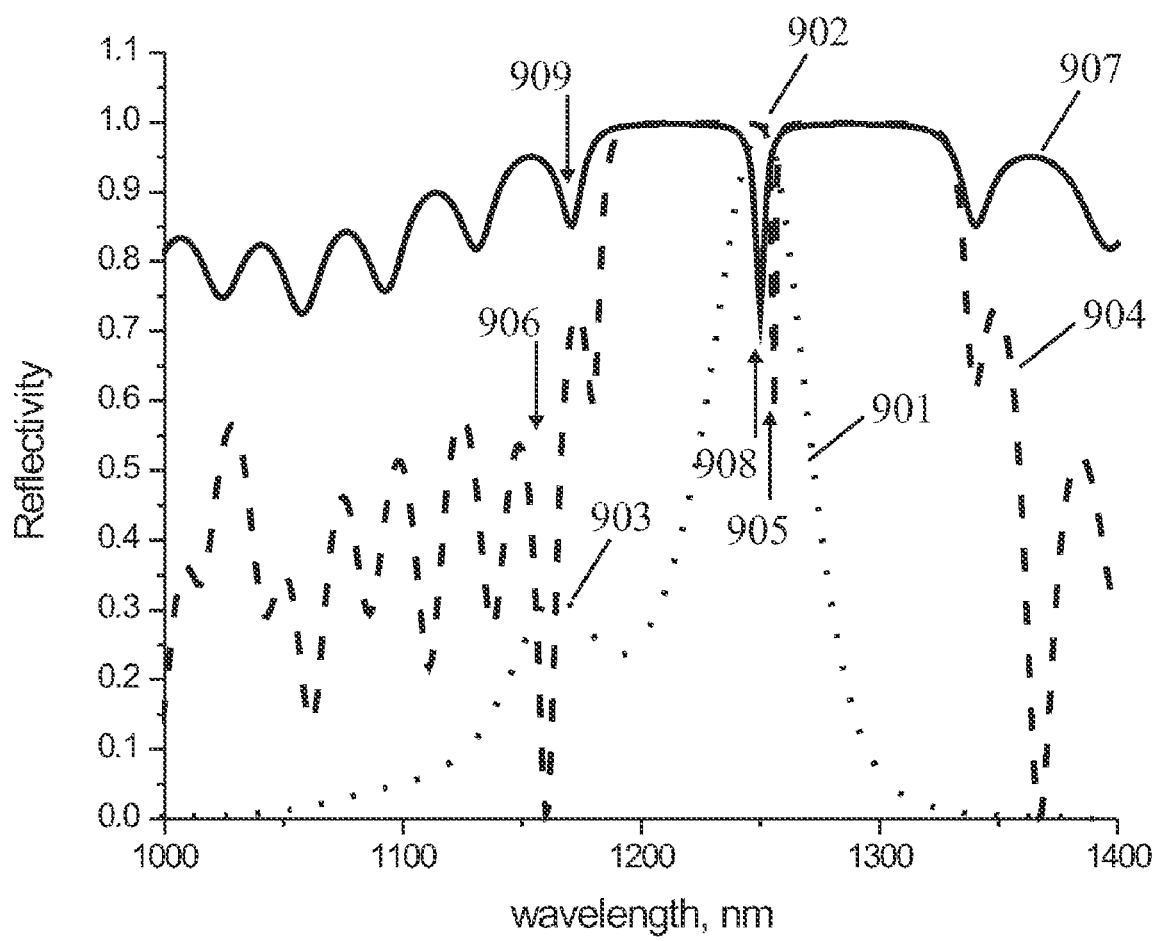
FIG. 9 shows examples of quantum dot emission spectrum and reflectance spectra of the resonant-cavity light-emitting diode.

FIG. 9 shows examples of quantum dot emission spectrum and reflectance spectra of the resonant-cavity light-emitting diode. The quantum dot emission spectrum (901) has one longer-wavelength maximum (902), which is associated with the ground-state emission, and another shorter-wavelength maximum (903), which is associated with the excited-state emission.

The reflectance spectrum (904) of a conventional resonant-cavity light-emitting diode typically has a central minimum (905) within a stopband and a number of spectral minima, other than the central minimum (905). One spectral minimum (906), other than the central minimum (905), has a spectral position which nearly corresponds to the spectral position of the excited-state emission maximum (903). Because the reflectivity of the spectral minimum (906) is quite low (lower than 0.3), the output emission spectrum of the conventional resonant-cavity light-emitting diode comprises an intense spectral maximum, other than the main maximum.

The reflectance spectrum (907) of a resonant-cavity light-emitting diode according to an embodiment of the present invention is modified compared to the spectrum (904) owing to the use of the top-side dielectric distributed Bragg reflector (706) having a broad stopband. The reflectance spectrum has a central minimum (908) within a stopband and a number of spectral minima, other than the central minimum (908). One spectral minimum (909), other than the central minimum (908), has a spectral position which nearly corresponds to the spectral position of the excited-state emission maximum (903). As opposed to the spectrum (904), the reflectivity of the spectral minimum (909) is sufficiently high (preferably greater than 0.75). As a result, an intensity of the spectral maximum, other than the main maximum, in the output emission spectrum of the resonant-cavity light-emitting diode according to an embodiment of the present invention is suppressed.

The long-wavelength resonant-cavity light-emitting diode of the present invention preferably emits at least 6 mW and more preferably at least 8 mW at an operating current of less than 100 mA and an operation voltage of less than 3 V.

The long-wavelength resonant-cavity light-emitting diode of the present invention preferably demonstrates the main maximum of the emission spectrum within 1.15-1.35 µm and more preferably around 1.25 µm. The spectral width (full width at half maximum) of the main maximum is preferably 20-30 nm. An intensity of maxima, other than the main maximum of the emission spectrum, is preferably less than 1% of an intensity of the main maximum. The output power at a current of 100 mA is preferably at least 6 mW and more preferably at least 8 mW. The operation voltage preferably does not exceed 3 V. This combination of parameters makes such a device useful as an inexpensive optical source for various applications.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. A resonant-cavity light-emitting diode comprising:
 a) a substrate;
 b) a layered structure deposited on the substrate, comprising:
  i) an n-type bottom-side distributed Bragg reflector;
  ii) a top-side distributed Bragg reflector;
  iii) a resonant cavity located between the bottom-side distributed Bragg reflector and the top-side distributed Bragg reflector, comprising a light-emitting quantum dot active region including a plurality of self-organized quantum dots; and
  iv) a p-n junction, which is capable of providing electrons and holes to the active region under forward bias;
 c) an n-ohmic contact located on a bottom surface of the substrate;
 d) an array of mesa structures comprising the layered structure and a p-ohmic contact located on a portion of a top surface of each of the mesa structures, wherein each mesa structure is a discrete device; and
 e) a quantum well, wherein an absorption peak of the quantum well is shifted to a shorter wavelength than a wavelength of a ground state luminescence of the quantum dots, and wherein the absorption peak of the quantum well approximately coincides with a wavelength of the excited-state luminescence of the quantum dot active region;
 wherein an emission spectrum of the resonant-cavity light-emitting diode includes a main maximum of the emission spectrum which falls into a spectral range from approximately 1.15 to 1.35 µm; and
 wherein an intensity of maxima, other than the main maximum of the emission spectrum, is less than or equal to 1% of an intensity of the main maximum.

2. The resonant-cavity light-emitting diode of claim 1, wherein the quantum dots comprise a plurality of (In,Ga)As quantum dots.

3. The resonant-cavity light-emitting diode of claim 1, wherein the quantum dots comprise a plurality of (In,Ga)(As,N) quantum dots.

4. The resonant-cavity light-emitting diode of claim 1, wherein the substrate is an n-type GaAs substrate.

5. The resonant-cavity light-emitting diode of claim 4, wherein the quantum dots comprise a plurality of (In,Ga)As quantum dots.

6. The resonant-cavity light-emitting diode of claim 4, wherein the quantum dots comprise a plurality of (In,Ga)(As,N) quantum dots.

7. The resonant-cavity light-emitting diode of claim 1 further comprising a current spreading region which improves a uniformity of the current density over the area of the mesa structure.

8. A resonant-cavity light-emitting diode comprising:
 a) a substrate;
 b) a layered structure deposited on the substrate, comprising:
  i) an n-type bottom-side distributed Bragg reflector;
  ii) a top-side distributed Bragg reflector;
  iii) a resonant cavity located between the bottom-side distributed Bragg reflector and the top-side distributed Bragg reflector, comprising a light-emitting quantum dot active region including a plurality of self-organized quantum dots; and
  iv) a p-n junction, which is capable of providing electrons and holes to the active region under forward bias;
 c) an n-ohmic contact located on a bottom surface of the substrate;
 d) an array of mesa structures comprising the layered structure and a p-ohmic contact located on a portion of a top surface of each of the mesa structures, wherein each mesa structure is a discrete device; and
 e) a quantum well, wherein an absorption peak of the quantum well is shifted to a shorter wavelength than a wavelength of a ground state luminescence of the quantum dots, and wherein the absorption peak of the quantum well approximately coincides with a wavelength of the excited-state luminescence of the quantum dot active region;
 wherein an emission spectrum of the resonant-cavity light-emitting diode includes a main maximum and a plurality of other maxima, wherein an intensity of the other maxima is less than or equal to 1% of an intensity of the main maximum.

9. The resonant-cavity light-emitting diode of claim 8, wherein the quantum dots comprise a plurality of (In,Ga)As quantum dots.

10. The resonant-cavity light-emitting diode of claim 8, wherein the quantum dots comprise a plurality of (In,Ga)(As,N) quantum dots.

11. The resonant-cavity light-emitting diode of claim 8, wherein the substrate is an n-type GaAs substrate.

12. The resonant-cavity light-emitting diode of claim 11, wherein the quantum dots comprise a plurality of (In,Ga)As quantum dots.

13. The resonant-cavity light-emitting diode of claim 11, wherein the quantum dots comprise a plurality of (In,Ga)(As,N) quantum dots.

14. The resonant-cavity light-emitting diode of claim 8, further comprising a current spreading region which improves a uniformity of the current density over the area of the mesa structure.

15. A resonant-cavity light-emitting diode comprising:
a) a substrate;
b) a layered structure deposited on the substrate, comprising:
   i) an n-type bottom-side distributed Bragg reflector;
   ii) a top-side distributed Bragg reflector;
   iii) a resonant cavity located between the bottom-side distributed Bragg reflector and the top-side distributed Bragg reflector, comprising a light-emitting quantum dot active region including a plurality of self-organized quantum dots; and
   iv) a p-n junction, which is capable of providing electrons and holes to the active region under forward bias;
c) an n-ohmic contact located on a bottom surface of the substrate;
d) an array of mesa structures comprising the layered structure and a p-ohmic contact located on a portion of a top surface of each of the mesa structures, wherein each mesa structure is a discrete device; and
e) a quantum well that absorbs the excited-state luminescence of the quantum dot active region such that the intensity of the maxima other than the main maximum is suppressed;
wherein an emission spectrum of the resonant-cavity light-emitting diode includes a main maximum of the emission spectrum which falls into a spectral range from approximately 1.15 to 1.35 μm; and
wherein an intensity of maxima, other than the main maximum of the emission spectrum, is less than or equal to 1% of an intensity of the main maximum.

16. A resonant-cavity light-emitting diode comprising:
a) a substrate;
b) a layered structure deposited on the substrate, comprising:
   i) an n-type bottom-side distributed Bragg reflector;
   ii) a top-side distributed Bragg reflector;
   iii) a resonant cavity located between the bottom-side distributed Bragg reflector and the top-side distributed Bragg reflector, comprising a light-emitting quantum dot active region including a plurality of self-organized quantum dots; and
   iv) a p-n junction, which is capable of providing electrons and holes to the active region under forward bias;
c) an n-ohmic contact located on a bottom surface of the substrate;
d) an array of mesa structures comprising the layered structure and a p-ohmic contact located on a portion of a top surface of each of the mesa structures, wherein each mesa structure is a discrete device; and
e) a quantum well that absorbs the excited-state luminescence of the quantum dot active region such that the intensity of the maxima other than the main maximum is suppressed;
wherein an emission spectrum of the resonant-cavity light-emitting diode includes a main maximum and a plurality of other maxima, wherein an intensity of the other maxima is less than or equal to 1% of an intensity of the main maximum.

17. A resonant-cavity light-emitting diode comprising:
a) a substrate;
b) a layered structure deposited on the substrate, comprising:
   i) an n-type bottom-side distributed Bragg reflector;
   ii) a top-side distributed Bragg reflector
   iii) a resonant cavity located between the bottom-side distributed Bragg reflector and the top-side distributed Bragg reflector, comprising a light-emitting quantum dot active region including a plurality of self-organized quantum dots; and
   iv) a p-n junction, which is capable of providing electrons and holes to the active region under forward bias;
c) an n-ohmic contact located on a bottom surface of the substrate;
d) an array of mesa structures comprising the layered structure and a p-ohmic contact located on a portion of a top surface of each of the mesa structures, wherein each mesa structure is a discrete device; and
e) a quantum well, which absorbs the excited-state luminescence of the quantum dot active region but does not absorb the ground-state luminescence of the quantum dot active region;
wherein an emission spectrum of the resonant-cavity light-emitting diode includes a main maximum of the emission spectrum which falls into a spectral range from approximately 1.15 to 1.35 μm; and
wherein an intensity of maxima, other than the main maximum of the emission spectrum, is less than or equal to 1% of an intensity of the main maximum.

18. A resonant-cavity light-emitting diode comprising:
a) a substrate;
b) a layered structure deposited on the substrate, comprising:
   i) an n-type bottom-side distributed Bragg reflector;
   ii) a top-side distributed Bragg reflector;
   iii) a resonant cavity located between the bottom-side distributed Bragg reflector and the top-side distributed Bragg reflector, comprising a light-emitting quantum dot active region including a plurality of self-organized quantum dots; and
   iv) a p-n junction, which is capable of providing electrons and holes to the active region under forward bias;
c) an n-ohmic contact located on a bottom surface of the substrate;
d) an array of mesa structures comprising the layered structure and a p-ohmic contact located on a portion of a top surface of each of the mesa structures, wherein each mesa structure is a discrete device; and
e) a quantum well, which absorbs the excited-state luminescence of the quantum dot active region but does not absorb the ground-state luminescence of the quantum dot active region;
wherein an emission spectrum of the resonant-cavity light-emitting diode includes a main maximum and a plurality of other maxima, wherein an intensity of the other maxima is less than or equal to 1% of an intensity of the main maximum.

19. The resonant-cavity light-emitting diode of claim 15, further comprising a current spreading region which improves a uniformity of the current density over the area of the mesa structure.

20. The resonant-cavity light-emitting diode of claim 16, further comprising a current spreading region which improves a uniformity of the current density over the area of the mesa structure.

21. The resonant-cavity light-emitting diode of claim 17, further comprising a current spreading region which improves a uniformity of the current density over the area of the mesa structure.

22. The resonant-cavity light-emitting diode of claim 18, further comprising a current spreading region which improves a uniformity of the current density over the area of the mesa structure.

\* \* \* \* \*